United States Patent
Ratnam et al.

(10) Patent No.: US 10,403,378 B1
(45) Date of Patent: Sep. 3, 2019

(54) PERFORMING AN OPERATION ON A MEMORY CELL OF A MEMORY SYSTEM AT A FREQUENCY BASED ON TEMPERATURE

(71) Applicant: MICRON TECHNOLOGY, INC., Boise, ID (US)

(72) Inventors: Sampath K. Ratnam, Boise, ID (US); Vamsi Pavan Rayaprolu, San Jose, CA (US); Mustafa N. Kaynak, San Diego, CA (US); Peter Feeley, Boise, ID (US); Kishore Kumar Muchherla, Fremont, CA (US); Renato C. Padilla, Folsom, CA (US); Shane Nowell, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/991,822

(22) Filed: May 29, 2018

Related U.S. Application Data

(60) Provisional application No. 62/628,682, filed on Feb. 9, 2018.

(51) Int. Cl.
| | | |
|---|---|---|
| *G11C 11/34* | (2006.01) | |
| *G11C 16/34* | (2006.01) | |
| *G11C 7/04* | (2006.01) | |
| *G11C 7/22* | (2006.01) | |
| *G11C 11/56* | (2006.01) | |
| *G11C 16/04* | (2006.01) | |
| *G11C 16/26* | (2006.01) | |

(52) U.S. Cl.
CPC .......... *G11C 16/3427* (2013.01); *G11C 7/04* (2013.01); *G11C 7/22* (2013.01); *G11C 11/5642* (2013.01); *G11C 16/0483* (2013.01); *G11C 16/26* (2013.01); *G11C 2207/22* (2013.01)

(58) Field of Classification Search
CPC ......... G11C 16/3427; G11C 7/04; G11C 7/22; G11C 11/5642; G11C 16/0483; G11C 16/26; G11C 2207/22
USPC ..................................................... 365/185.02
See application file for complete search history.

(56) References Cited

U.S. PATENT DOCUMENTS

| | | | | |
|---|---|---|---|---|
| 6,560,725 B1 * | 5/2003 | Longwell | .............. | G06F 11/073 711/105 |
| 7,882,369 B1 * | 2/2011 | Kelleher | ............... | G06F 1/3203 713/300 |

(Continued)

OTHER PUBLICATIONS

International Search Report and Written Opinion for International Patent Application Serial No. PCT/US2019/017104, dated May 22, 2019, 10 pages.

(Continued)

*Primary Examiner* — Viet Q Nguyen
(74) *Attorney, Agent, or Firm* — Lowenstein Sandler LLP

(57) ABSTRACT

A temperature associated with the memory component is determined. A frequency to perform an operation on a memory cell associated with the memory component is determined based on the temperature associated with the memory component. The operation is performed on the memory cell at the determined frequency to transition the memory cell from a state associated with an increased error rate for data stored at the memory cell to another state associated with a decreased error rate for the data stored at the memory cell.

17 Claims, 5 Drawing Sheets

(56) References Cited

U.S. PATENT DOCUMENTS

| | | | |
|---|---|---|---|
| 10,078,546 B2* | 9/2018 | Muchherla | G06F 11/08 |
| 2003/0191888 A1* | 10/2003 | Klein | G06F 1/3225 |
| | | | 711/105 |
| 2005/0246558 A1 | 11/2005 | Ku | |
| 2005/0281112 A1* | 12/2005 | Ito | G11C 11/406 |
| | | | 365/222 |
| 2008/0123217 A1* | 5/2008 | Ishii | G11B 5/02 |
| | | | 360/78.04 |
| 2008/0263383 A1 | 10/2008 | Kneble et al. | |
| 2011/0219274 A1 | 9/2011 | Beom-Sig et al. | |
| 2012/0300563 A1 | 11/2012 | Kyu-Hyoun et al. | |
| 2014/0192583 A1* | 7/2014 | Rajan | G11C 7/10 |
| | | | 365/63 |
| 2016/0239235 A1* | 8/2016 | Chung | G06F 3/0629 |
| 2017/0271031 A1* | 9/2017 | Sharon | G11C 29/42 |
| 2018/0299935 A1* | 10/2018 | Jeong | G06F 1/206 |
| 2019/0066802 A1* | 2/2019 | Malshe | G11C 16/26 |

OTHER PUBLICATIONS

Wonyoung, NAND flash memory error correction and signal processing, In: IDEC Newsletter (whole vol. No. 175), Jan. 2012, pp. 10-13 <http://idec.knu.ac.kr/bbs/board.php?bo_table=m61&wr_id=132&year=2012>.

* cited by examiner

PERFORMING AN OPERATION ON A MEMORY CELL OF A MEMORY SYSTEM AT A FREQUENCY BASED ON TEMPERATURE

RELATED APPLICATION

This application claims the benefit under 35 U.S.C. § 119(e) of U.S. Provisional Application 62/628,682 filed on Feb. 9, 2018.

TECHNICAL FIELD

Embodiments of the disclosure relate generally to memory systems, and more specifically, relate to performing an operation on a memory cell of a memory system at a frequency based on temperature.

BACKGROUND

A memory system can be a storage system, such as a solid-state drive (SSD), and can include one or more memory components that store data. A memory sub-system can include memory components such as non-volatile memory components and volatile memory components. In general, a host system can utilize a memory system to store data at the memory components of the memory system and to retrieve data from the memory components of the memory sub-system.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
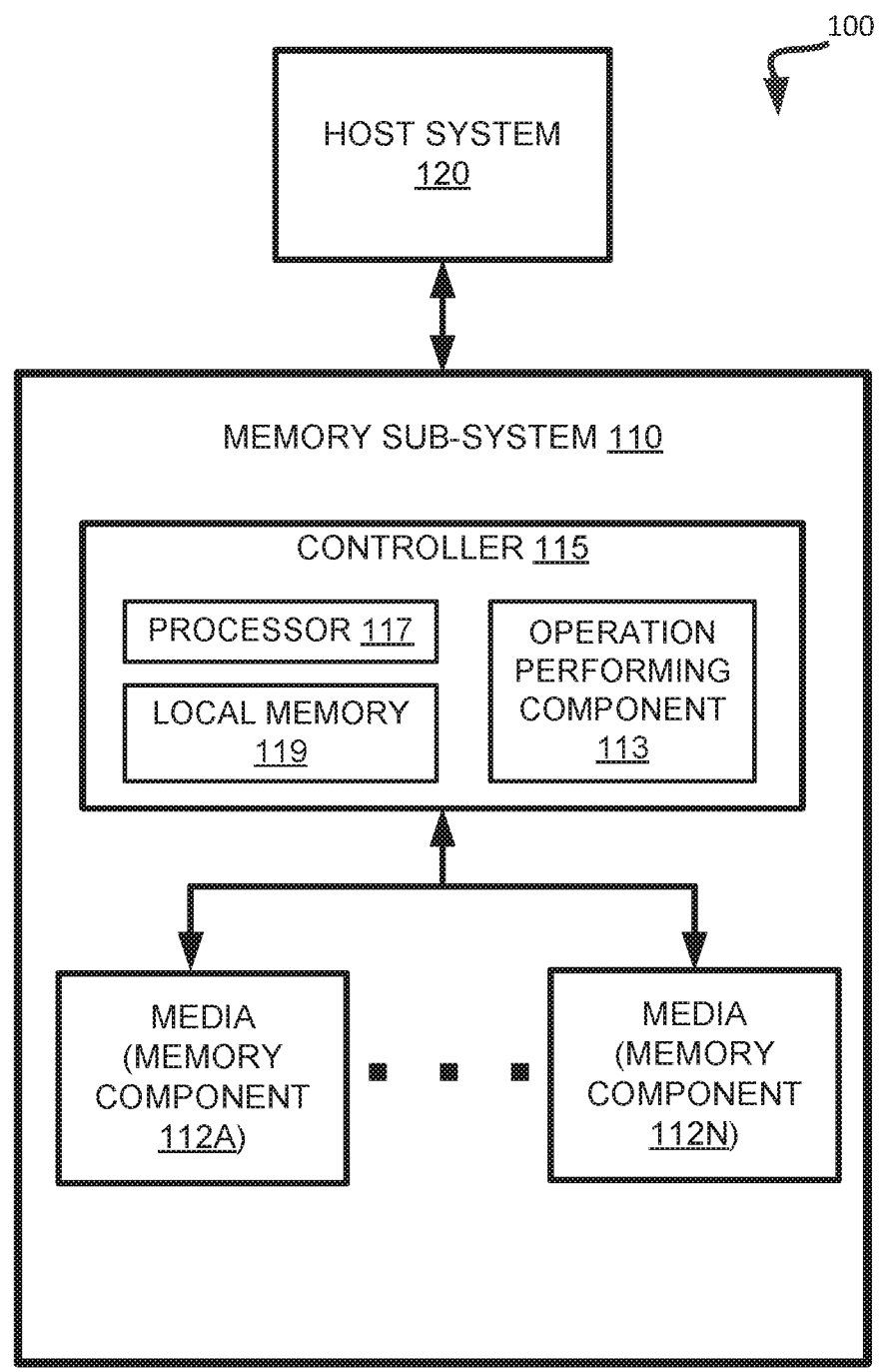
FIG. 1 illustrates an example computing environment that includes a memory sub-system in accordance with some embodiments of the present disclosure.

Aspects of the present disclosure are directed to performing an operation on a memory cell of a memory system at a frequency based on temperature. Examples of a memory system include a storage system, such as a solid-state drive (SSD), and a hybrid memory/storage system. In general, a host system can utilize a memory system that includes one or more memory components. The data can be stored and retrieved from the memory components within the storage system.

A memory component of a conventional memory system can include memory cells where each memory cell can store one or more bits of binary data corresponding to data received from the host system. Generally, when an operation (e.g., read, write, or erase operation) is performed on the memory cell, the memory cell can be at a transient threshold voltage ($V_t$) state. In some embodiments, the transient $V_t$ state corresponds to a physical state of the memory cell where electrons are distributed throughout the memory cell. In a conventional memory system, after the operation is performed, the memory cell that can transition to a stable $V_t$ state over time. The stable $V_t$ state can correspond to another physical state of the memory cell where electrons are not distributed throughout the memory cell. Instead, the electrons are more distributed towards the edges or exterior of the memory cell as opposed to being distributed throughout the interior of the memory cell. The amount of time for the memory cell to transition from a transient $V_t$ state to a stable $V_t$ state can depend on various factors, such as the temperature of the memory cell. For example, a memory cell at a lower temperature can transition to a stable $V_t$ state more quickly than a memory cell at a higher temperature. Data stored on the memory cell while the memory cell is in the stable $V_t$ state can be corrupted or incorrectly stored at the memory cell, resulting in a higher error rate of the data stored at the memory cell. As a result, an increased use of an error detection and correction operation (i.e., an error control operation) can be used on subsequent operations (e.g., read and/or write) performed on the memory cell. The increased use of the error control operation can result in a reduction of the performance of the conventional memory system as more resources of the memory system are used to perform the error control operation more frequently instead of performing other read operations or write operations.

Aspects of the present disclosure address the above and other deficiencies by mitigating the stable $V_t$ state of an idle memory cell so that the memory cells are kept in a transient $V_t$ state. For example, a temperature associated with a memory component is determined. Since the amount of time for a memory cell to transition from a transient $V_t$ state to a stable $V_t$ state is dependent on the temperature of the memory cell, a frequency to perform an operation (e.g., how often the operation is performed) on the memory cell of the memory component is determined based on the temperature of the memory component that includes the memory cell. For example, if a memory component has a lower temperature, then the operation can be performed at a higher frequency (e.g., more often) than the frequency of performance of the operation on a memory cell that is at a higher temperature. The operation transitions the memory cell from a state that is associated with an increased error rate for data stored at the memory cell (e.g., a stable $V_t$ state) to an initial state that is associated with a decreased error rate for the data stored at the memory cell (e.g., a transient $V_t$ state). The operation is performed on the memory cell to transition the memory cell from the state associated with the increased error rate for the data stored at the memory cell to the initial state associated with the decreased error rate for the data stored at the memory cell at the determined frequency. In embodiments, operations to transition the memory cell can be performed on the memory cell until the number of operations exceeds a threshold. For example, if the threshold number of read operations is 100 for a period of time, then 100 operations can be performed on the memory cell during the period of time, after which subsequent operations intended to transition the memory cell from the stable $V_t$ state to the transient $V_t$ state are no longer performed on the memory cell until the period of time has elapsed. This can reduce effects of a read disturb of a particular memory cell. Read disturb is the result of continually reading from one memory cell without intervening erase operations causing other nearby memory cells to change over time (e.g., become programmed). Therefore, in order to preserve the data stored at nearby memory cells and reduce the effects of a read disturb, subsequent read operations are not performed after the threshold number of read operations have been performed on the memory cell.

In some embodiments, read operations can be performed for all of the memory cells at the memory components of the memory system so that the memory cells are more likely to be at the transient $V_t$ state. The read operations can be performed at a frequency that is based on the operating temperature of the memory system. For example, the read operations can be cycled through the memory cells of the storage device at a frequency that is based on the operating temperature of the memory system. More memory cells can be subjected to operations at a particular time when the operating temperature of the memory system is lower than when the operating temperature of the memory system is higher.

In some embodiments, a reset read operation can be used when performing operations to transition memory cells from the stable $V_t$ state to the transient $V_t$ state. A read operation can include multiple steps or processes such as applying a voltage to a word line that includes a particular memory cell and performing a voltage or current sensing step at the particular memory cell. The read operation can further include error detection and correction operations and return data from the particular memory cell to a controller of the memory system. In contrast, the reset read operation can include fewer steps or processes than the read operation. For example, the reset read operation can apply the voltage to the word line that includes the particular memory cell without performing additional steps or processes such as the sensing of a current, error detection and correction operations, or returning any data to the controller.

Advantages of the present disclosure include, but are not limited to, an increased reliability of data stored at the memory system. For example, memory cells of a memory system can be kept in a transient $V_t$ state as opposed to the stable $V_t$ state, resulting in a reduced error rate associated with data stored at the memory cell. Thus, the data stored on the memory cells can use fewer error control operations when retrieving the data. Furthermore, keeping the memory cells of a memory system in a transient $V_t$ state can prevent the loss of data stored at the memory system and protect data that is programmed to the memory system. Thus, the reliability of the memory system and data stored at the memory system is increased. Furthermore, in a memory system implementing a multi-pass programming scheme, keeping the memory cells of the memory system in a transient $V_t$ state between programming passes can result in fewer error control operations when retrieving the data.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an operation performing component 113 that can be used to store data at a particular memory component based on a corresponding usage threshold. In some embodiments, the controller 115 includes at least a portion of the characteristic component 113. For example, the controller 115 can include a processor 117 (processing device) configured to execute instructions stored in local memory 119 for performing the operations described herein. In some embodiments, the characteristic component 113 is part of the host system 110, an application, or an operating system.

The operation performing component 113 can determine a temperature associated with a memory component (e.g., memory components 112A-N). The operation performing component 113 can determine a frequency to perform an operation to transition a memory cell of the memory component from a state associated with an increased error rate for data stored at the memory cell (e.g., stable $V_t$ state) to the initial state associated with a decreased error rate for the data stored at the memory cell (e.g., transient $V_t$ state) based on the temperature associated with the memory component. The initial state corresponds to the state the memory cell is in after a programming operation, such as a write operation, stores the data at the memory cell. The operation performing component 113 can perform the operation to transition a memory cell associated with the memory component from the state associated with an increased error rate for data stored at the memory cell to the initial state associated with a decreased error rate for the data stored at the memory cell at the determined frequency. Further details with regards to the operations of the operation performing component 113 are described below.

The memory system 110 can also include additional circuitry or components that are not illustrated. In some implementations, the memory system 110 can include a cache or buffer (e.g., DRAM) and address circuitry (e.g., a row decoder and a column decoder) that can receive an address from the controller 115 and decode the address to access the memory components 112A to 112N.

Figure 2:
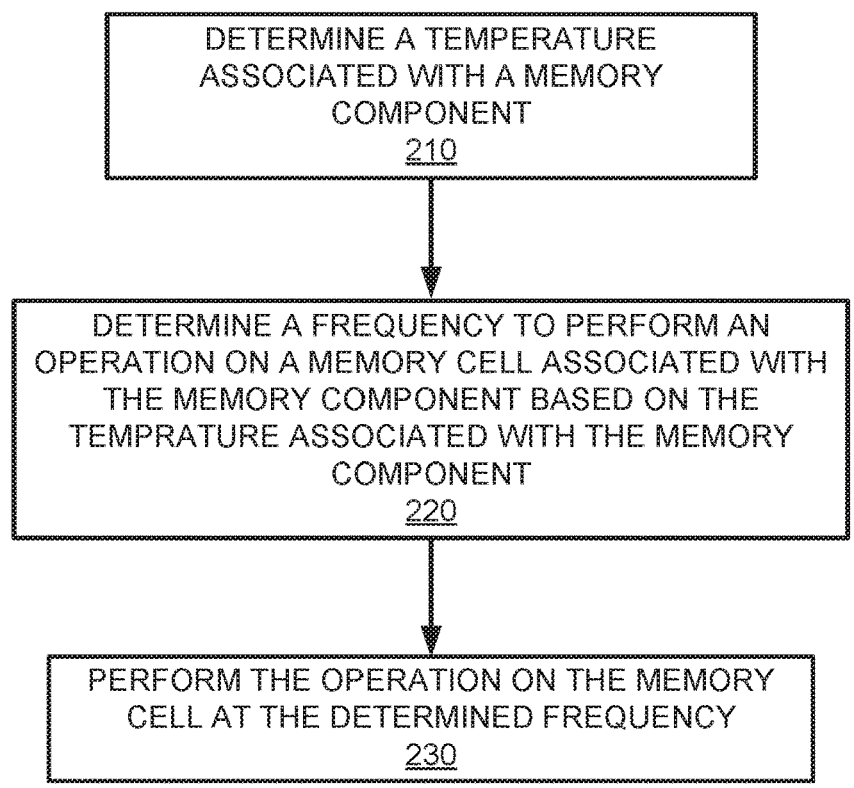
FIG. 2 is a flow diagram of an example method to perform an operation on a memory cell to transition the memory cell from one state to another state at a frequency that is based on a temperature associated with a memory component in accordance with some embodiments of the present disclosure.

FIG. 2 is a flow diagram of an example method 200 to perform an operation on a memory cell to transition the memory cell from one state to another state at a frequency that is based on a temperature associated with a memory component, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the operation performing component 113 of FIG. 1.

At block 210, a processing device determines a temperature associated with a memory component (e.g., memory components 112A-N). In embodiments, the temperature can correspond to the temperature of the memory component. In some embodiments, the temperature can correspond to the temperature of the memory system that includes the memory component. The temperature can be determined by a temperature sensor that is included in the memory system. At block 220, a frequency to perform an operation on a memory cell associated with the memory component is determined based on the temperature associated with the memory component. The operation transitions the memory cell from a state associated with an increased error rate for data stored at the memory cell (e.g., stable $V_t$ state) to an initial state associated with a decreased error rate for the data stored at the memory cell (e.g., transient $V_t$ state).

At block 230, the operation is performed on the memory cell to transition the memory cell from the state associated with the increased error rate for the data stored at the memory cell to the initial state associated with the decreased error rate for the data stored at the memory cell at the determined frequency. In embodiments, the operation can be performed to keep the memory cell in the state associated with the decreased error rate for data stored at the memory. In an embodiment, the operation can be a read operation performed on the memory cell. A read operation can include multiple steps or processes such as applying a voltage to a word line that includes a particular memory cell and performing a voltage or current sensing step at the particular memory cell. The read operation can further include error detection and correction operations and return data from the particular memory cell to a controller. In embodiments, the operation can be a reset read operation performed on the memory cell. The reset read operation can include fewer steps or processes than the read operation. For example, the reset read operation can apply the voltage to the word line that includes the particular memory cell without performing additional steps or processes such as the sensing of a current, error detection and correction operations, or returning any data to the controller. In embodiments, the operation can be performed at a higher frequency (e.g., more often) for a memory component at a lower temperature than a memory component at a higher temperature.

In an embodiment, the determined frequency can dynamically change over a period of time. For example, if the temperature of the memory component decreases over a period of time, then the determined frequency can increase. Conversely, if the temperature of the memory component increases over a period of time, then the determined frequency can decrease.

Although the present example describes performing an operation, such as a read operation or a read reset operation, on one memory cell of a memory component, in embodiments the operation can be performed on multiple memory cells of multiple memory components of a memory system. In one embodiment, the operations can be performed at a frequency that is based on the operating temperature of the memory system. For example, the read operations can be cycled through (e.g., performed on) the memory cells of the memory components of the memory system at a frequency that is based on the operating temperature of the memory system. More memory cells can be subjected to operations at a particular time when the operating temperature of the memory system is lower than when the operating temperature of the memory system is higher. In some embodiments, the operation to transition a first memory cell of a first memory component can be performed at a first frequency that corresponds to a first temperature of the first memory component and can be performed on a second memory cell of a second memory component at a second frequency that corresponds to a second temperature of the second memory component. Thus, the operations that are performed to transition the state of the memory cell to another state can be performed at different rates for different memory components that are at different temperatures.

Figure 3:
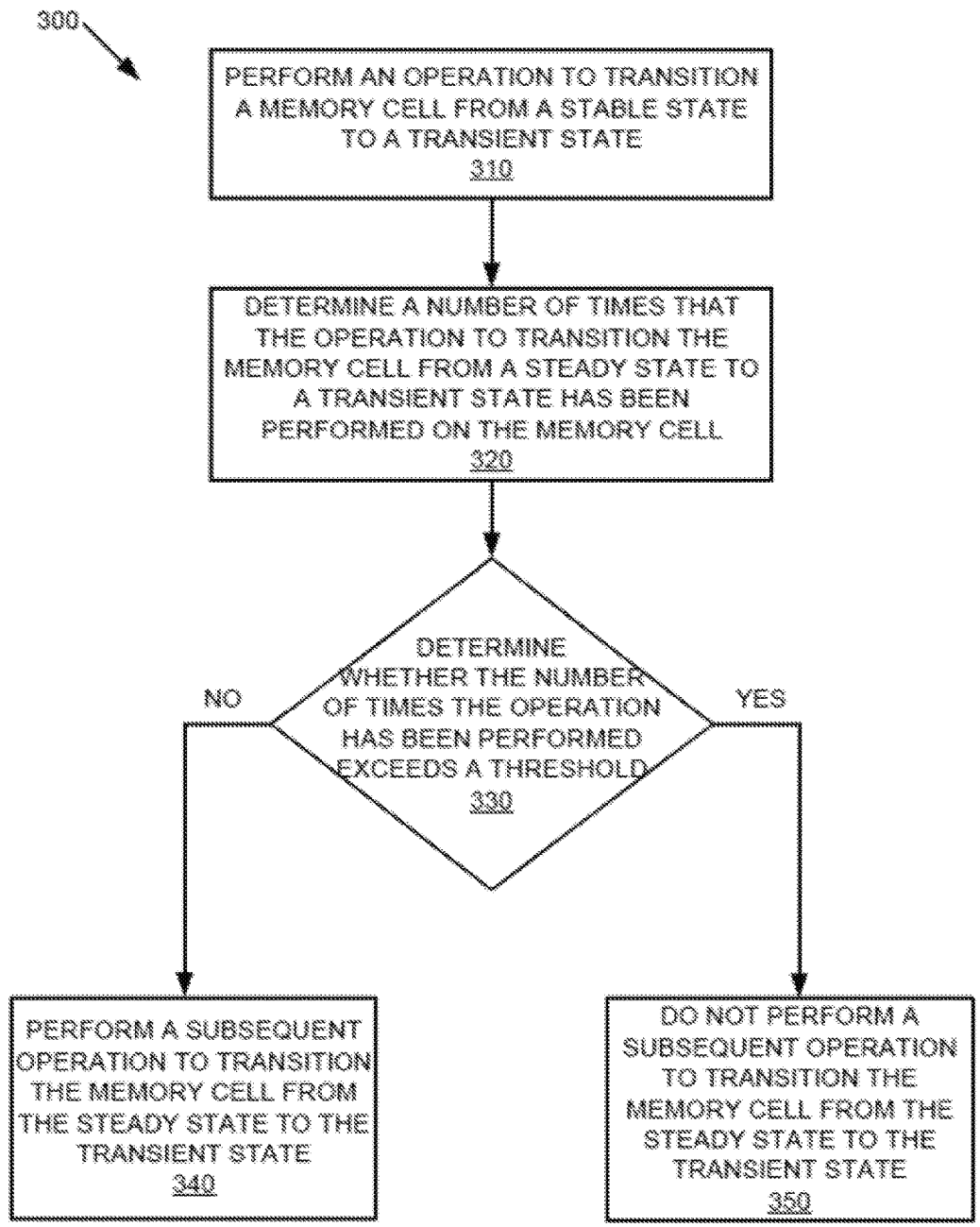
FIG. 3 is a flow diagram of an example method to determine whether to perform a subsequent operation on a memory cell based on a number of times that an operation has been performed on the memory cell in accordance with some embodiments of the present disclosure.

FIG. 3 is a flow diagram of an example method 300 to determine whether to perform a subsequent operation on a memory cell based on a number of times an operation has been performed on the memory cell, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the operation performing component 113 of FIG. 1.

At block 310, an operation is performed on a memory cell to transition the memory cell from a stable $V_t$ state to a transient $V_t$ state, as previously discussed. At block 320, processing device determines a number of times that the operation to transition the memory cell from the stable $V_t$ state to the transient $V_t$ state has been performed on the memory cell. At block 330, a determination is made as to whether the number of times that the operation has been performed on the memory cell exceeds a threshold. In an embodiment, the threshold can be associated with a number of times that the operation can be performed on a memory cell before a read disturb can likely affect nearby memory cells. For example, if a read disturb is likely to affect nearby memory cells after 100 operations, then the threshold can be less than 100 operations. If the operation has been performed a number of times that does not exceed the threshold, then method 300 proceeds to block 340. For example, if the threshold is the performance of 30 operations on the memory cell and 15 operations have been performed on the memory cell, then the number of times that the operation has been performed on the memory cell does not exceed the threshold. At block 340, a subsequent operation to transition the memory cell from the stable $V_t$ state to the transient $V_t$ state is performed on the memory cell. For example, a read operation or a read reset operation is performed on the memory cell. In embodiments, the subsequent operation can be performed to keep the memory cell in the state associated with the decreased error rate for data stored at the memory. In some embodiments, because the number of operations is less than the threshold, a read disturb affecting a nearby memory cell is unlikely, and therefore a subsequent operation can be performed on the memory cell with little risk of affecting the nearby memory cells.

If the number of times that the operation has been performed on the memory cell exceeds the threshold, then method 300 proceeds to block 350. For example, if the threshold is the performance of 30 operations on the memory cell and 31 operations have been previously performed on the memory cell, then the number of times that the operation has been performed on the memory cell exceeds the threshold. At block 350, a subsequent operation to transition the memory cell from the steady state to the transient state is not performed on the memory cell. In an embodiment, because the number of operations is greater than the threshold, a read disturb affecting a nearby memory cell is likely, and therefore a subsequent operation being performed on the memory cell has a high risk of affecting nearby memory cells. Therefore, a subsequent operation to transition the memory cell is not performed. In some embodiments, other operations that do not transition the memory cell can be performed on the memory cell even if the number of times the operation has been performed exceeds the threshold. For example, if a read request is received from the host system, a read operation can be performed on the memory cell despite the number of operations being performed on the memory cell exceeding the threshold. Thus, a read operation can be performed on the memory cell in response to a read request from a host system when the number of times that the operation has been performed exceeds the threshold while a read operation to transition the memory cell (e.g., not in response to a read request from the host system) may not be performed when the number of times that the operation has been performed exceeds the threshold.

In some embodiments, a subsequent operation to transition the memory cell from the stable $V_t$ state to the transient $V_t$ state is not performed on the memory cell until an amount of time has elapsed. For example, if the number of times that the operation has been performed on the memory cell exceeds a threshold, a subsequent operation is not performed on the memory cell until an hour has elapsed. In embodiments, after the amount of time has elapsed, the count for the number of times the operation has been performed on the memory cell can be reset and method 300 can be repeated. For example, the count on the number of times the operation has been performed on the memory cell can be reset from 31 to 0 and the operation to transition the memory cell from the stable $V_t$ state to the transient $V_t$ state can be performed on the memory cell. In some embodiments, an intervening erase operation being performed on the memory cell can reset the count on the number of times the operation has been performed on the memory cell. For example, the count on the number of times the operation has been performed can be 31 times. Then, if an erase operation is performed on the memory cell, the count can be reset from 31 to 0.

Figure 4:
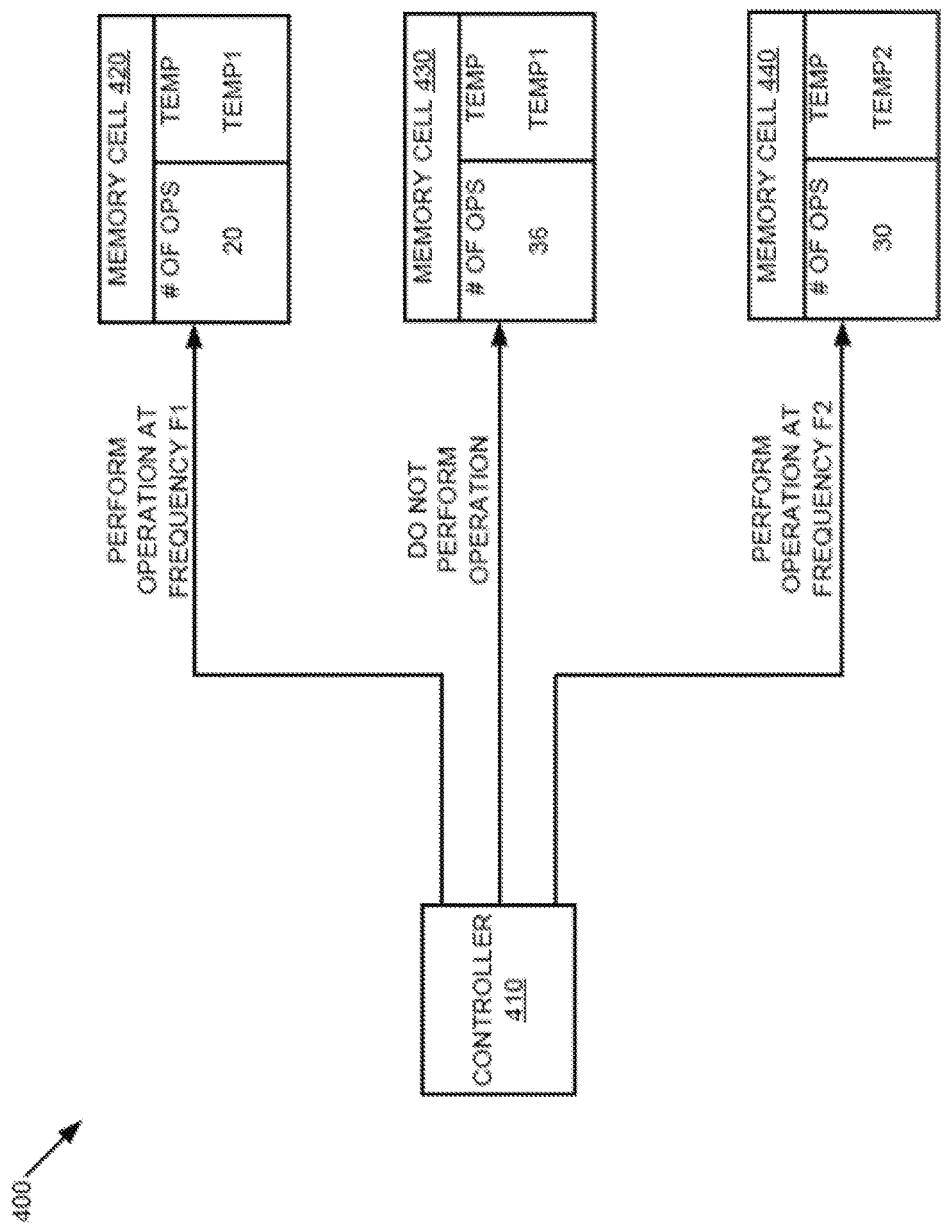
FIG. 4 illustrates a block diagram of an example of performing operations on memory cells of a memory system in accordance with some embodiments of the present disclosure.

FIG. 4 illustrates a block diagram 400 of an example of performing operations on memory cells of a memory system, in accordance with some embodiments of the present disclosure. In some implementations, the operations are performed by operation performing component 113 of FIG. 1.

In the present example, controller 410 can represent controller 115 of FIG. 1. Memory cells 420, 430 and 440 can be located at one or more of memory components 112A-N of FIG. 1. Each of the memory cells 420, 430 and 440 are associated with a corresponding number of times an operation to transition the memory cell has been performed on the memory cell (e.g., # OF OPS) and a corresponding temperature (e.g., TEMP) associated with the memory cell. In one embodiment, the corresponding temperatures associated with the memory cells 420, 430 and 440 can correspond to the temperatures of the memory components at which the memory cells 420, 430 and 440 are located. Controller 410 can identify the corresponding number of times that an operation has been performed on the memory cell and the corresponding temperature to determine whether to perform subsequent operations on memory cells 420, 430 and 440 and, if subsequent operations are to be performed, at what frequency. In the present example, the threshold for the number of operations that can be performed on a memory cell is 35 operations.

For memory cell 420, the corresponding number of operations performed on memory cell 420 is 20, which does not exceed the threshold for the number of operations that can be performed (e.g., 35). Because the number of operations performed on memory cell 420 does not exceed the threshold, a first frequency is determined for the performance of subsequent operations on memory cell 420 based on the corresponding temperature (e.g., TEMP1) associated with memory cell 420. Subsequent operations to transition the memory cell 420 are performed on the memory cell 420 at the first frequency (e.g., F1). For memory cell 430, the corresponding number of operations performed is 36, which exceeds the threshold for the number of operations that can be performed (e.g., 35). Subsequent operations are not performed on memory cell 430 since the number of operations that have been performed on memory cell 430 exceeds the threshold. For memory cell 440, the corresponding number of operations that have been performed on memory cell 440 is 30, which does not exceed the threshold for the number of operations that can be performed. Since the number of operations performed on memory cell 440 does not exceed the threshold, a second frequency is determined for the performance of subsequent operations on memory cell 440 based on the corresponding temperature (e.g., TEMP2) associated with memory cell 440. Subsequent operations to transition memory cell 440 are performed on memory cell 440 at the second frequency (e.g., F2). The subsequent operations can be performed until the number of operations that have been performed on the corresponding memory cell exceeds the threshold.

Figure 5:
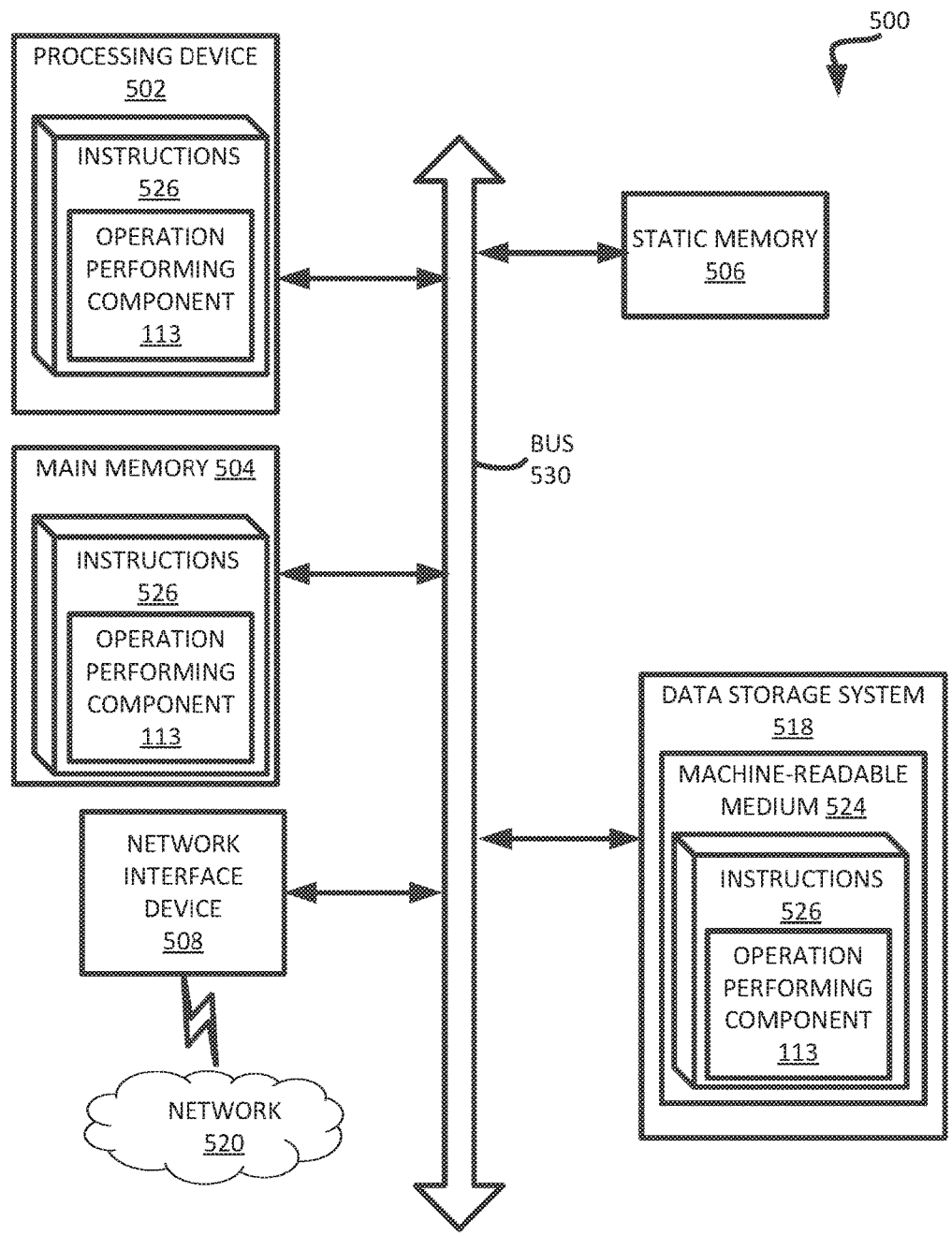
FIG. 5 is a block diagram of an example computer system in which implementations of the present disclosure can operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the operation performing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an operation performing component (e.g., the operation performing component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component; and
   a processing device, operatively coupled with the memory component, to:
      determine a temperature associated with the memory component;
      determine a frequency to perform an operation on a memory cell associated with the memory component based on the temperature associated with the memory component; and
      perform the operation on the memory cell at the determined frequency to transition the memory cell from a state associated with an increased error rate for data stored at the memory cell to another state associated with a decreased error rate for the data stored at the memory cell, wherein the another state associated with the decreased error rate for the data stored at the memory cell corresponds to a transient threshold voltage state, and the state associated with the increased error rate for the data stored at the memory cell corresponds to a stable threshold voltage state.

2. The system of claim 1, wherein the operation corresponds to an application of a voltage to a word line of the memory cell without returning the data stored at the memory cell when the voltage is applied to the word line.

3. The system of claim 1, wherein the operation corresponds to a read operation of the memory cell.

4. The system of claim 1, wherein the determined frequency is increased for a lower determined temperature than when the memory component is associated with a higher determined temperature.

5. The system of claim 1, wherein the processing device is further to:
   determine a number of times that the operation to transition the memory cell has been performed;
   determine whether the number of times that the operation has been performed exceeds a threshold; and
   in response to determining that the number of times that the operation has been performed exceeds the threshold, determine to not perform a subsequent operation on the memory cell to transition the memory cell from the state associated with the increased error rate for the data stored at the memory cell to the another state associated with the decreased error rate for the data stored at the memory cell.

6. The system of claim 5, wherein the processing device is further to:
determine an amount of time that has elapsed since the operation has been performed exceeds a second threshold; and
in response to the amount of time that has elapsed since the operation has been performed exceeds the second threshold, perform the subsequent operation on the memory cell to transition the memory cell from the state associated with the increased error rate for the data stored at the memory cell to the another state associated with the decreased error rate for the data stored at the memory cell.

7. A method comprising:
determining a temperature associated with a memory component;
determining a frequency to perform an operation on a memory cell associated with the memory component based on the temperature associated with the memory component; and
performing, by a processing device, the operation on the memory cell at the determined frequency to keep the memory cell in a state associated with a decreased error rate for the data stored at the memory cell, wherein the state associated with the decreased error rate for the data stored at the memory cell corresponds to a transient threshold voltage state.

8. The method of claim 7, wherein the operation corresponds to an application of a voltage to a word line of the memory cell without returning the data stored at the memory cell when the voltage is applied to the word line.

9. The method of claim 7, wherein the operation corresponds to a read operation of the memory cell.

10. The method of claim 7, wherein the determined frequency is increased for a lower determined temperature than when the memory component is associated with a higher determined temperature.

11. The method of claim 7, further comprising:
determining a number of times that the operation to keep the memory cell in the state associated with the decreased error rate for the data stored at the memory cell has been performed;
determining whether the number of times that the operation has been performed exceeds a threshold; and
in response to determining that the number of times that the operation has been performed exceeds the threshold, determining to not perform a subsequent operation on the memory cell to keep the memory cell in the state associated with the decreased error rate for the data stored at the memory cell.

12. The method of claim 11, further comprising:
determining an erase operation has been performed on the memory cell; and
in response to determining the erase operation has been performed on the memory cell, performing the subsequent operation on the memory cell to keep the memory cell in the state associated with the decreased error rate for the data stored at the memory cell.

13. A non-transitory computer-readable storage medium comprising instructions that, when executed by a processing device, cause the processing device to:
determine a temperature associated with a memory component;
determine a frequency to perform an operation on a memory cell associated with the memory component based on the temperature associated with the memory component; and
perform the operation on the memory cell at the determined frequency to transition the memory cell from a state associated with an increased error rate for data stored at the memory cell to another state associated with a decreased error rate for the data stored at the memory cell, wherein the another state associated with the decreased error rate for the data stored at the memory cell corresponds to a transient threshold voltage state, and the state associated with the increased error rate for the data stored at the memory cell corresponds to a stable threshold voltage state.

14. The non-transitory computer-readable storage medium of claim 13, wherein the operation corresponds to an application of a voltage to a word line of the memory cell without returning the data stored at the memory cell when the voltage is applied to the word line.

15. The non-transitory computer-readable storage medium of claim 13, wherein the operation corresponds to a read operation of the memory cell.

16. The non-transitory computer-readable storage medium of claim 13, wherein the determined frequency is increased for a lower determined temperature than when the memory component is associated with a higher determined temperature.

17. The non-transitory computer-readable storage medium of claim 13, wherein the processing device is further to:
determine a number of times that the operation to transition the memory cell has been performed;
determine whether the number of times that the operation has been performed exceeds a threshold; and
in response to determining that the number of times that the operation has been performed exceeds the threshold, determine to not perform a subsequent operation on the memory cell to transition the memory cell from the state associated with the increased error rate for the data stored at the memory cell to the another state associated with the decreased error rate for the data stored at the memory cell.

* * * * *